(12) United States Patent
Jhang et al.

(10) Patent No.: US 8,969,946 B2
(45) Date of Patent: Mar. 3, 2015

(54) SEMICONDUCTOR DEVICE AND METHODS OF MANUFACTURING

(71) Applicant: Macronix International Co., Ltd., Hsinchu (TW)

(72) Inventors: Pei-Ci Jhang, New Taipei (TW); Zong-Jie Ko, Kaohsiung (TW); Yumin Lin, Taipei (TW); Jung-Yu Shieh, Hsinchu (TW); Jeng Hwa Liao, Hsinchu (TW)

(73) Assignee: Macronix International Co., Ltd. (TW)

( * ) Notice: Subject to any disclaimer, the term of this patent is extended or adjusted under 35 U.S.C. 154(b) by 38 days.

(21) Appl. No.: 13/890,081

(22) Filed: May 8, 2013

(65) Prior Publication Data
US 2014/0264544 A1    Sep. 18, 2014

Related U.S. Application Data

(60) Provisional application No. 61/776,934, filed on Mar. 12, 2013.

(51) Int. Cl.
H01L 29/792    (2006.01)
H01L 21/28    (2006.01)
H01L 29/66    (2006.01)

(52) U.S. Cl.
CPC .... *H01L 21/28052* (2013.01); *H01L 29/66833* (2013.01)
USPC .......................................................... 257/324

(58) Field of Classification Search
USPC .......................................................... 257/324
See application file for complete search history.

(56) References Cited

U.S. PATENT DOCUMENTS

| | | | |
|---|---|---|---|
| 6,429,062 B1* | 8/2002 | Rubin | 438/199 |
| 2004/0102013 A1* | 5/2004 | Hwang et al. | 438/313 |
| 2011/0147854 A1* | 6/2011 | Nandakumar et al. | 257/382 |
| 2012/0001267 A1* | 1/2012 | Lee et al. | 257/369 |
| 2012/0178234 A1* | 7/2012 | Lee et al. | 438/382 |
| 2014/0138759 A1* | 5/2014 | Lee et al. | 257/321 |

* cited by examiner

*Primary Examiner* — Thao P Le
(74) *Attorney, Agent, or Firm* — Baker & McKenzie LLP

(57) ABSTRACT

A semiconductor device includes polysilicon layer and a metal silicide layer. The polysilicon layer is doped with carbon or phosphorous. The silicide layer is formed over the polysilicon layer.

15 Claims, 12 Drawing Sheets

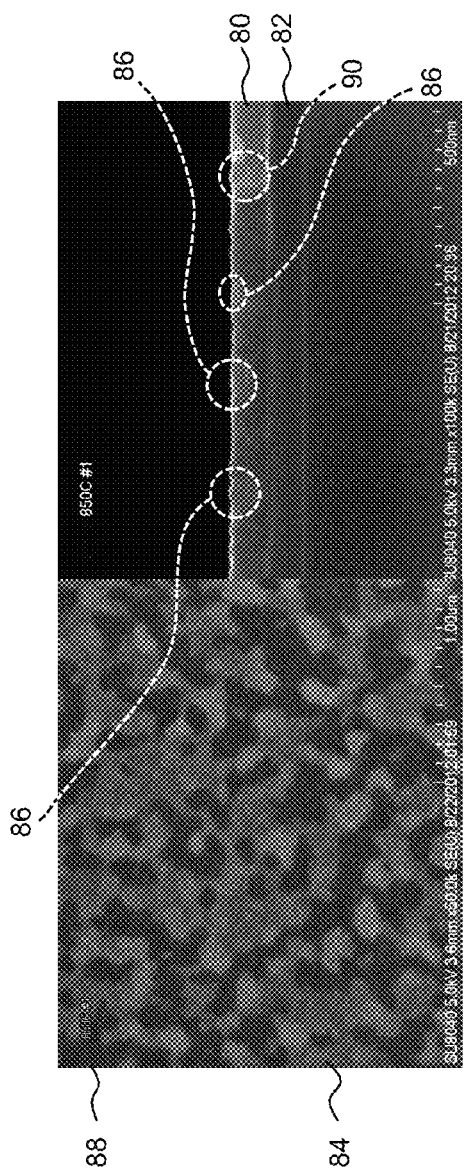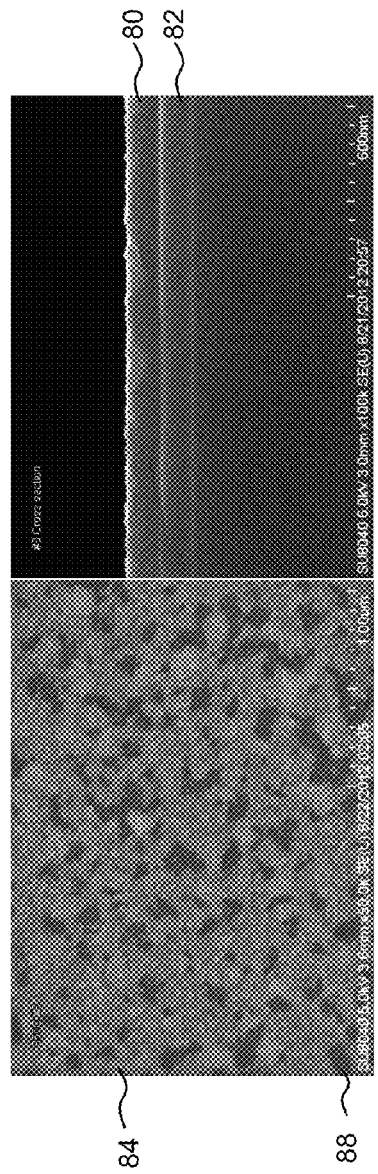

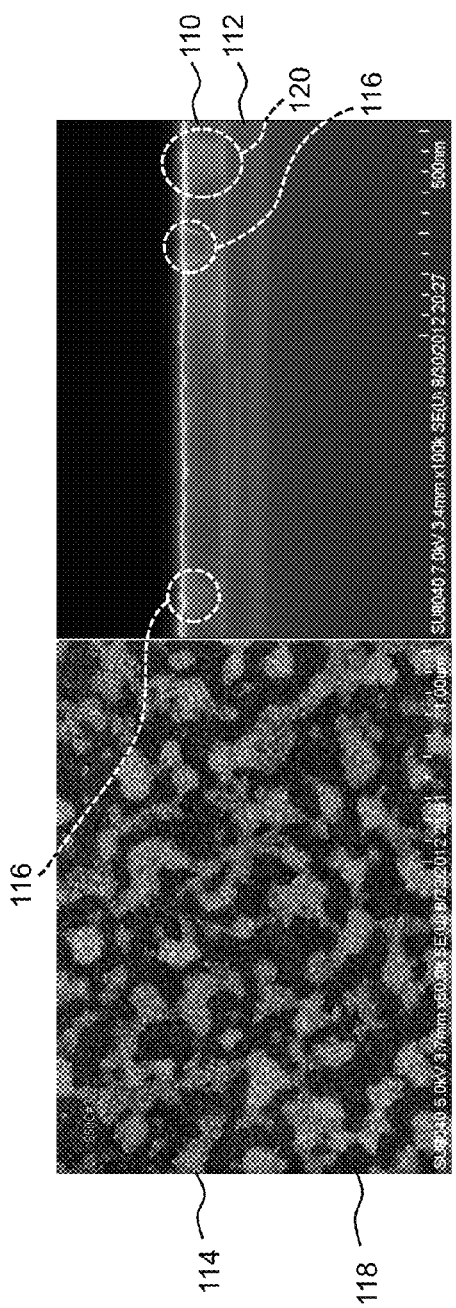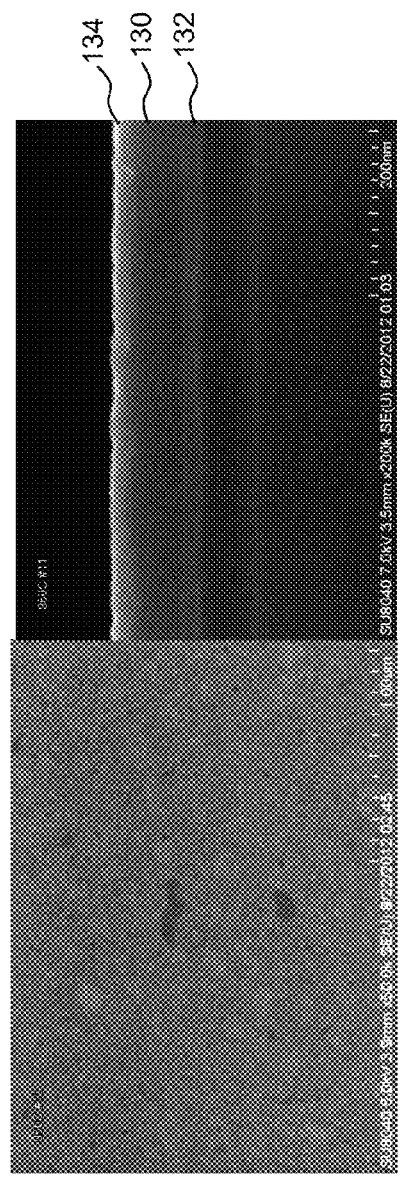

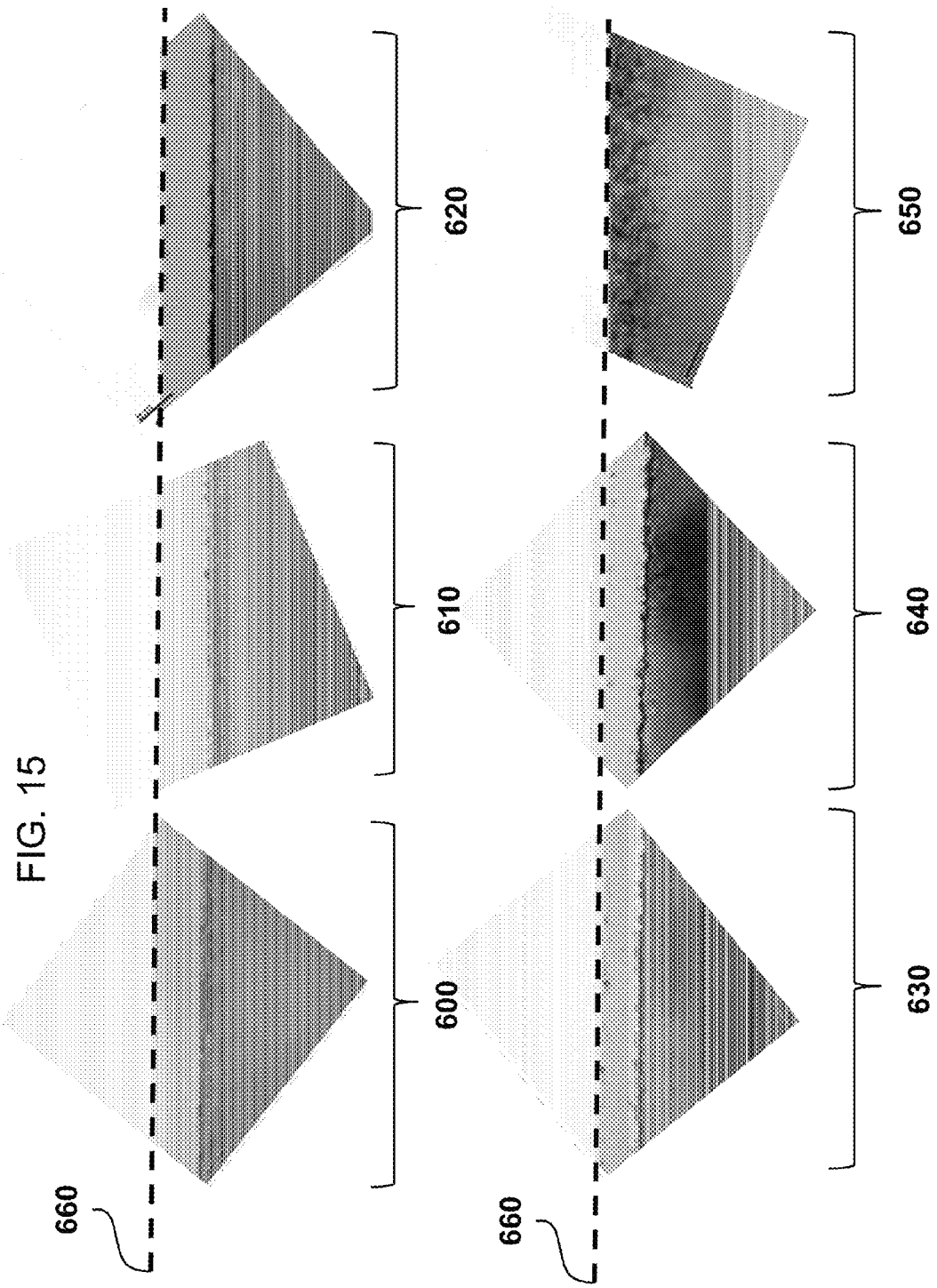

US 8,969,946 B2

SEMICONDUCTOR DEVICE AND METHODS OF MANUFACTURING

CROSS-REFERENCE TO RELATED APPLICATIONS

This application claims priority to U.S. Provisional App. Ser. No. 61/776,934, filed Mar. 12, 2013, which is hereby incorporated by reference in its entirety.

BACKGROUND

The present application relates generally to semiconductor devices and includes methods and structures for improving the formation of cobalt silicide.

Cobalt silicide for use in semiconductor devices has received attention because of a potential for low resistivity. However, sheet resistance is significantly and negatively impacted by high temperature annealing. Thus, the use of cobalt silicide has been impeded due to problems with thermal stability.

There is a need for improved processes and structures for the formation of cobalt silicide.

BRIEF SUMMARY

In an embodiment, a semiconductor device includes polysilicon layer and a silicide layer. The polysilicon layer is doped with carbon. The silicide layer is formed over the polysilicon layer.

In another embodiment, a method of forming a semiconductor device includes: forming a polysilicon layer doped with carbon; forming a metal layer over the polysilicon layer; and annealing the semiconductor device to form a metal silicide layer.

BRIEF DESCRIPTION OF THE DRAWINGS

FIG. 3A is a top view of an exemplary cobalt silicide layer formed with an undoped polysilicon layer with an annealing temperature below 900 C.

FIG. 3B is a cross-sectional view of an exemplary cobalt silicide layer formed with an undoped polysilicon layer with an annealing temperature below 900 C.

FIG. 4A is a top view of an exemplary cobalt silicide layer formed with a P-doped polysilicon layer with an annealing temperature below 900 C.

FIG. 4B is a cross-sectional view of an exemplary cobalt silicide layer formed with a P-doped polysilicon layer with an annealing temperature below 900 C.

FIG. 5A is a top view of an exemplary cobalt silicide layer formed with a P-doped polysilicon layer with an annealing temperature above 900 C.

FIG. 5B is a cross-sectional view of an exemplary cobalt silicide layer formed with a P-doped polysilicon layer with an annealing temperature above 900 C.

FIG. 6A is a top view of an exemplary cobalt silicide layer formed with a CP-doped polysilicon layer with an annealing temperature above 900 C.

FIG. 6B is a cross-sectional view of an exemplary cobalt silicide layer formed with a CP-doped polysilicon layer with an annealing temperature above 900 C.

FIG. 15 is cross-sectional views of exemplary semiconductor devices with carbon implantation carried out at different temperatures.

DETAILED DESCRIPTION

Figure 1:
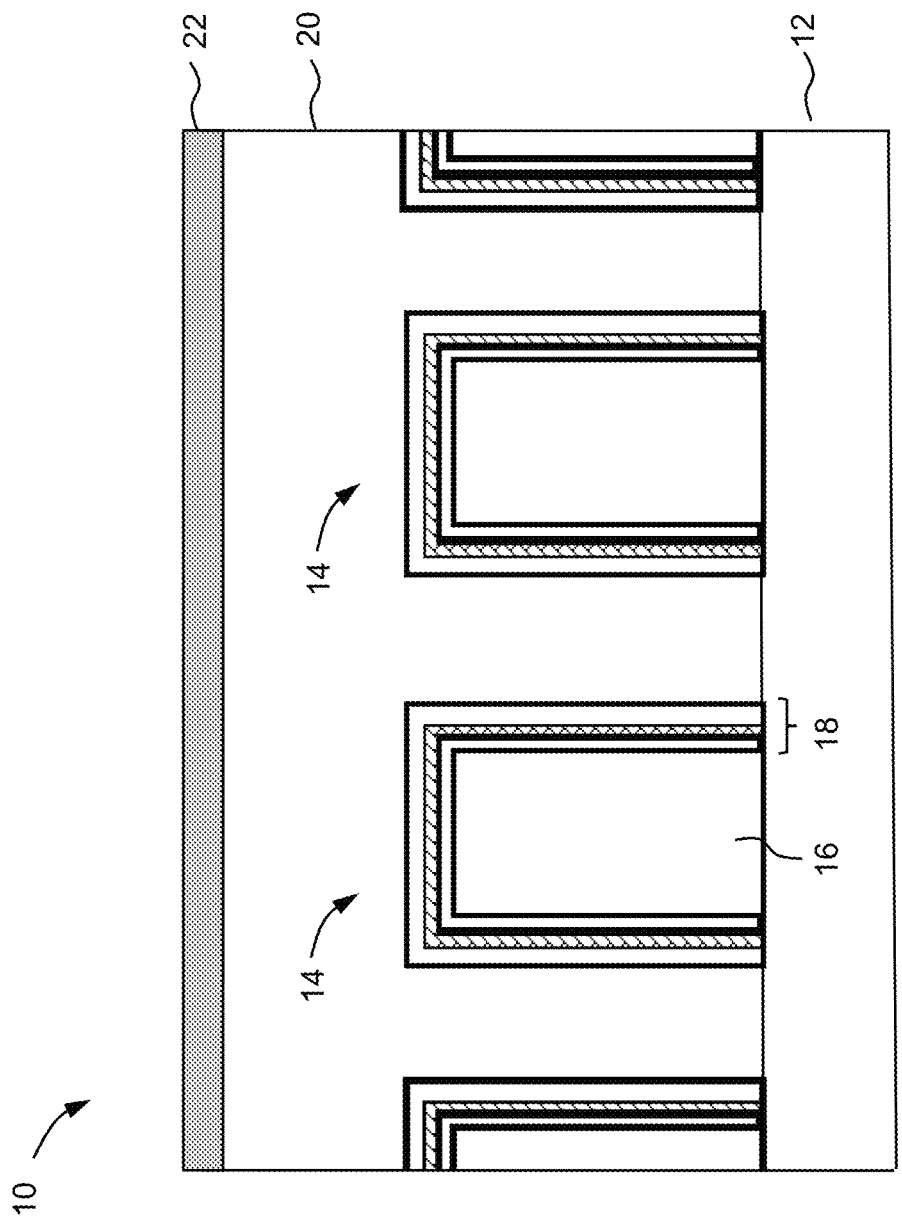
FIG. 1 is a cross-sectional view of an exemplary semiconductor device.

FIG. 1 shows an exemplary semiconductor device 10 having a substrate 12. The charge storage structures 14 are formed on the substrate 12. The first polysilicon layer 16 is formed on the charge storage structures 14. Layers 18 are, for example, oxide/nitride/oxide(ONO) stacked layers and formed on the first polysilicon layer 16 in this embodiment. A second polysilicon layer 20 is formed over the layers 18. The second polysilicon layer 20 may be doped with carbon (for example, 6e20 atoms/cm$^3$ of carbon), phosphorous (for example, (1.25e20 to 1.85e20 atoms/cm$^3$ of phosphorous), or both carbon and phosphorous. The second polysilicon layer 20 may be a control gate. A cobalt layer 22 is formed over the polysilicon layer 20. The semiconductor device 10 is exemplary in nature and the following discussion is also applicable to other semiconductor devices and aspects thereof.

After the cobalt layer 22 is formed over the second polysilicon layer 20, an annealing step is performed to form a cobalt silicide layer (e.g., $CoSi_2$, $CoSi_x$). A residual amount of phosphorous, carbon, or both carbon and phosphorous may be present in the cobalt silicide layer depending on the doping of the polysilicon layer that is used.

Figure 2:
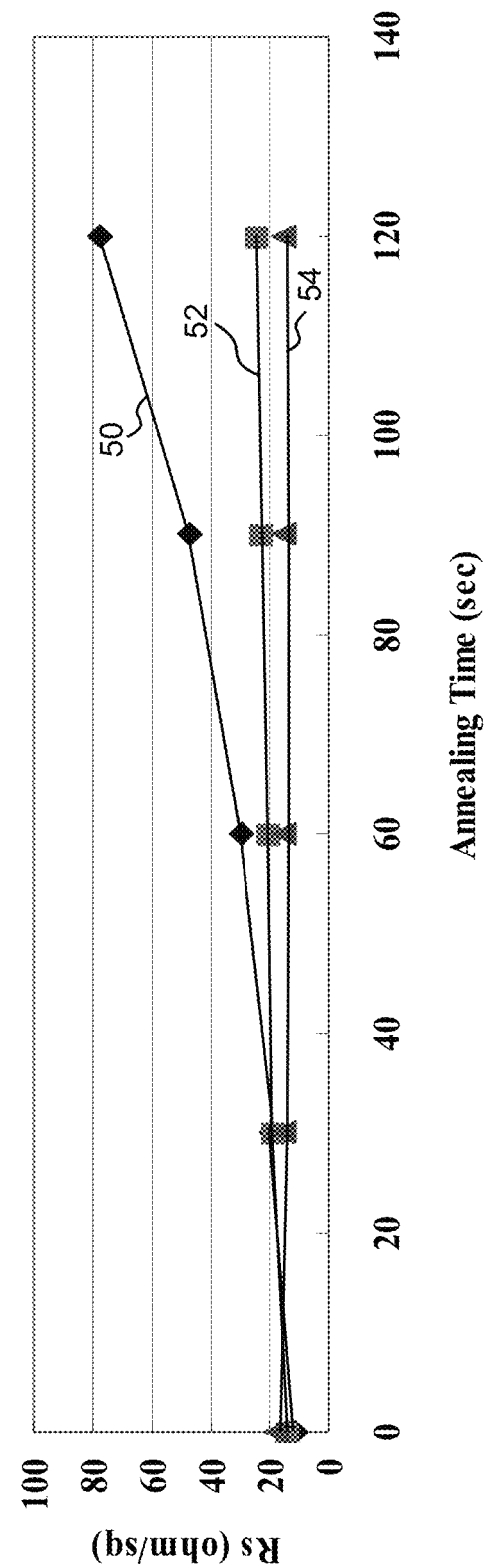
FIG. 2 is a plot of sheet resistance against annealing time.

FIG. 2 shows a sheet resistance (Rs (ohm/sq)) of a formed cobalt silicide with an annealing temperature below 900 C where the second polysilicon layer 20 is undoped (trace 50), the second polysilicon layer 20 is a phosphorous doped (P-doped) (trace 52) and the second polysilicon layer 20 is a carbon and phosphorous doped (CP-doped) (trace 54). The sheet resistance of the undoped second polysilicon layer 20 increases significantly with annealing time as compared to the P-doped and CP-doped second polysilicon layer 20. The formation of cobalt silicide islands and/or cobalt penetration to an oxide/polysilicon interface contribute to higher sheet resistance.

FIG. 3 show an exemplary cobalt silicide layer 80 formed with an undoped polysilicon layer with an annealing temperature below 900 C. The cobalt silicide layer 80 is formed over an oxide layer 82. The cobalt silicide 84 forms discrete islands 86 in the polysilicon 88, which may be formed from the grooving and agglomeration of decomposed cobalt silicide grains. The micro-structure of undoped polysilicon contributes to the agglomeration of cobalt silicide grains. Discrete cobalt silicide islands 86 and cobalt penetration to the oxide layer 82 at region 90 contribute to higher sheet resistance.

FIG. 4 show an exemplary cobalt silicide layer formed with a P-doped polysilicon layer with an annealing temperature below 900 C. The formation of cobalt silicide islands and penetration to the oxide layer 82 has been reduced or eliminated. P-doped polysilicon has a larger grain size as compared to undoped polysilicon. This larger grain size helps prevent cobalt penetration in the direction of the oxide layer 82 and thereby reduces cobalt agglomeration and punch through to the oxide. Thus, thermal stability can be improved and a lower sheet resistance can be achieved by P-doping the polysilicon. In the case of the semiconductor device 10 shown in FIG. 1, gate-source/drain leakage current can also be reduced.

FIG. 5 show an exemplary cobalt silicide layer 110 formed with a P-doped polysilicon layer with an annealing temperature above 900 C. The cobalt silicide layer 110 is formed over an oxide layer 112. At the higher annealing temperature as compared to FIG. 4, the cobalt silicide 114 may dissociate and form discrete islands 116 in the polysilicon 118. Cobalt penetration to the oxide layer 112 at region 120 may also occur.

FIG. 6 show an exemplary cobalt silicide layer formed with a CP-doped polysilicon layer with an annealing temperature above 900 C. The CP-doped polysilicon layer 130 is formed over the oxide layer 132. A cobalt silicide layer 134 is formed, for example grown epitaxially, over the CP-doped polysilicon layer 130. The formation of cobalt silicide islands and penetration to the oxide layer 132 has been reduced or eliminated. Thus, thermal stability can be improved and a lower sheet resistance can be achieved by CP-doping the polysilicon.

Figure 7:
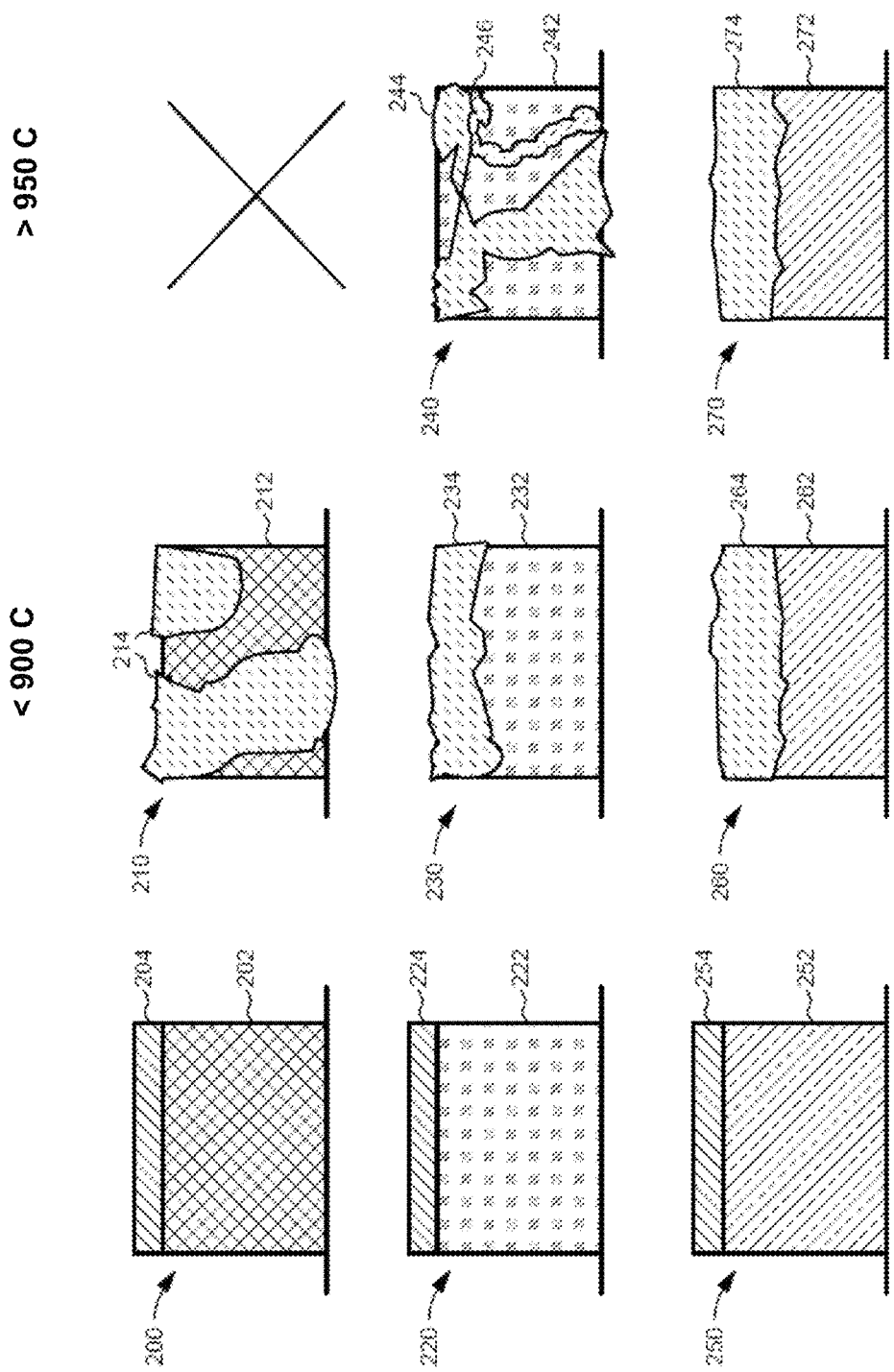
FIG. 7 is a cross-sectional view of exemplary cobalt silicide layer formation with varying doping and annealing temperatures.

FIG. 7 shows cross-sectional views of exemplary cobalt silicide formation with varying doping and annealing temperatures. A pre-formation semiconductor device 200 includes undoped polysilicon 202 and cobalt layer 204. A semiconductor device 210 results from annealing the device 200 at a temperature below 900 C. The device 210 includes regions of undoped polysilicon 212 and agglomerated discrete cobalt silicide (e.g., $CoSi_2$, $CoSi_x$) islands 214. A semiconductor device resulting from annealing the device 200 at a temperature above 950 C has such poor sheet resistance that it is not shown.

A pre-formation semiconductor device 220 includes P-doped polysilicon 222 and a cobalt layer 224. A semiconductor device 230 results from annealing the device 220 at a temperature below 900 C. The device 230 includes P-doped polysilicon 232 and a cobalt silicide (e.g., $CoSi_2$, $CoSi_x$) layer 234. A semiconductor device 240 results from annealing the device 220 at a temperature above 950 C. The device 430 includes P-doped polysilicon 242, cobalt silicide (e.g., $CoSi_2$, $CoSi_x$) 244, which may penetrate through to an underlying oxide, and dissociated cobalt 246.

A pre-formation semiconductor device 250 includes CP-doped polysilicon 252 and a cobalt layer 254. Semiconductor devices 260 and 270 result from annealing the device 250 at temperatures below 900 C and above 950 C respectively. The devices 260 and 270 respectively include CP-doped polysilicon 262 and 272 and cobalt silicde (e.g., $CoSi_2$, $CoSi_x$) layers 264 and 274.

Figure 8:
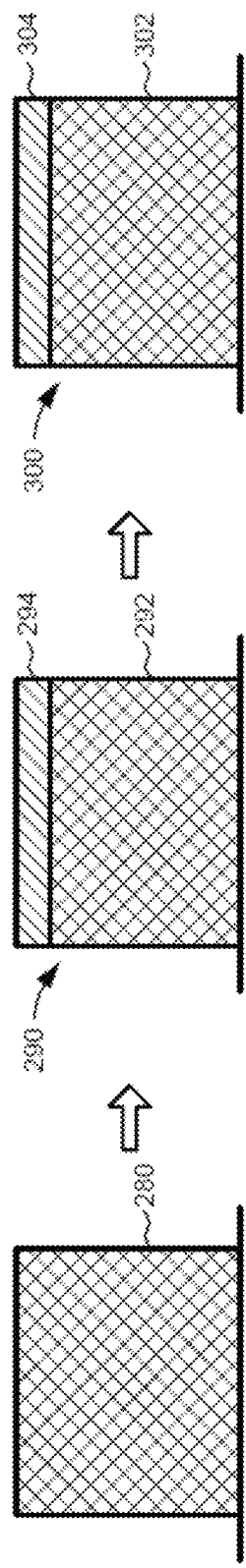
FIG. 8 is cross-sectional views of an exemplary formation of CP-doped polysilicon using ion implantation.

Referring to FIG. 8, CP-doped polysilicon may be formed starting with an undoped polysilicon layer 280. The undoped polysilicon layer 280 can be exposed to an ion implantation of phosphorous to form the device 290, which includes a layer 292 of undoped polysilicon and a layer 294 of P-doped polysilicon. The device 290 can be exposed to an ion implantation of carbon to form the device 300, which includes a layer 302 of undoped polysilicon and a layer 304 of CP-doped polysilicon.

Figure 9:
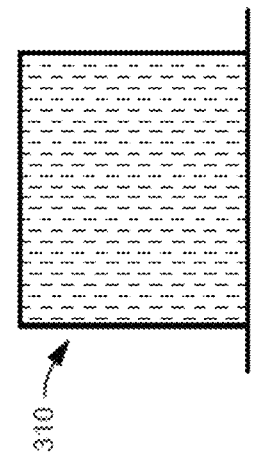
FIG. 9 is a cross-sectional view of an exemplary formation of CP-doped polysilicon using in-situ formation.

Referring to FIG. 9, CP-doped polysilicon may also be formed in-situ in a single step. For example, the CP-doped polysilicon may be deposited in a low pressure chemical vapor deposition (LPCVD) system. Forming the CP-doped polysilicon in-situ in a single step is a simpler, more efficient process. An exemplary advantage of the in-situ formation of CP doped polysilicon is that thermal stability of forming cobalt silicide can be improved in a simple and efficient process.

As compared to the ion implantation approach described with respect to FIG. 8, in-situ formation of CP-doped polysilicon offers an advantage in uniformity. In ion implantation, an average distance a group of implanted ions may travel is referred to as projected range (Rp). This projected range may vary and may lead to a non-uniform distribution of implanted ions concentrated in some areas and less concentrated in other areas. In-situ formation of CP-doped polysilicon does not have these concerns and Rp of the implementation does not have to be considered.

Figure 10:
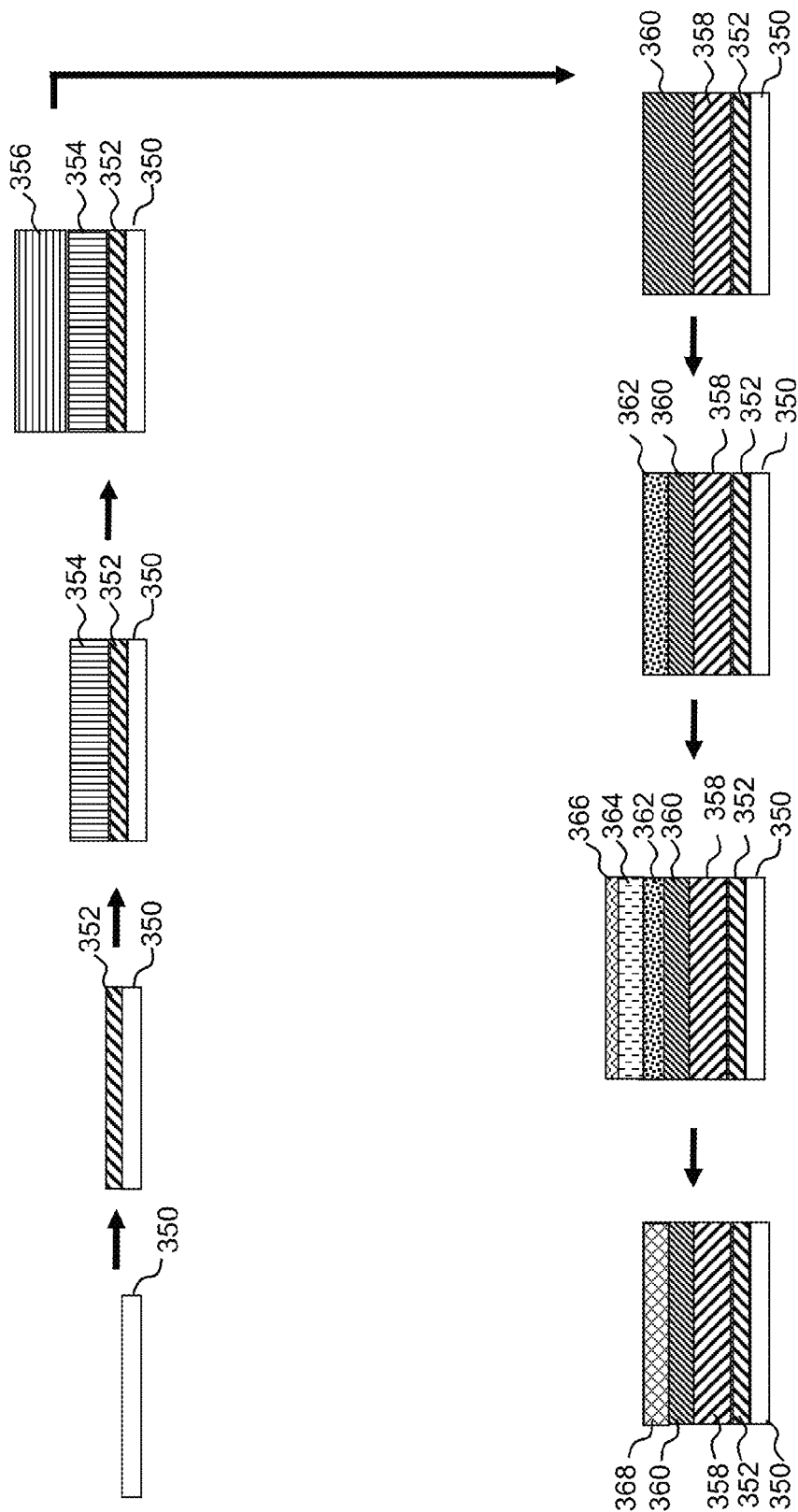
FIG. 10 is a flow diagram showing exemplary cross-sectional views of an exemplary process and structures for forming a cobalt silicide layer.

FIG. 10 shows a flow diagram showing exemplary cross-sectional views of an exemplary process and structures for forming a cobalt silicide layer. An oxide layer 352 is formed on a silicon wafer 350. The oxide layer 352 may be 200 angstroms thick. A first polysilicon layer 354 is formed on the oxide layer 352 and a second polysilicon layer 356 is formed on the first polysilicon layer 354. Forming two polysilicon layers in sequence provides for better control of various grain sizes though it will be appreciated that a single polysilicon layer may also be used. The first and second polysilicon layers may be P-doped. A thermal process is performed on the first polysilicon layer 354 and the second polysilicon layer 356 to provide the first treated polysilicon layer 358 and the second treated polysilicon layer 360. The thermal process may include an oxide film (REOX) process at 850 C for 14 sec, a low pressure TEOS process at 630 C for 4 hours and a nitride film (ILD0 SIN) process at 650 C for 2 hours and 20 minutes. These process with thermal treatment can cause the polysilicon to change grain size. An ion implantation of carbon (for example, using the parameters $C^+$, 15 keV, 2E15 $cm^{-3}$, −100 C) may be performed to provide the CP-doped polysilicon layer 362. A cobalt layer 364 and a TiN layer 366 may be formed over the CP-doped polysilicon layer 362, for example by deposition. An annealing step, for example by a rapid thermal process, may be performed to form the cobalt silicide layer 368.

Figure 11:
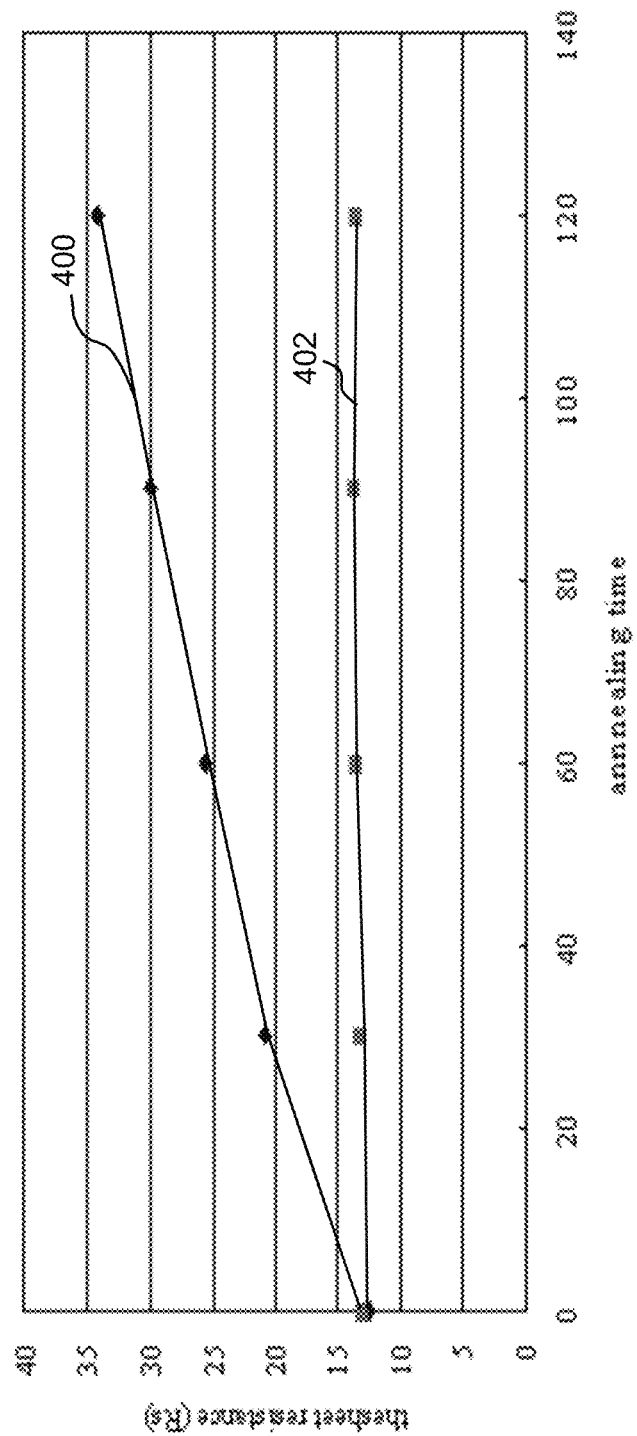
FIG. 11 is a plot of sheet resistance against annealing time.

FIG. 11 shows a sheet resistance (Rs (ohm/sq)) of the cobalt silicide layer 368 of FIG. 10 where the treated polysilicon layers 358 and 360 are P-doped at a concentration of 1.25E20 $cm^{-3}$ (trace 400) and the treated polysilicon layers 358 and 360 are P-doped at a concentration of 1.85E20 $cm^{-3}$ (trace 402). The sheet resistance of the cobalt silicide layer resulting from the lightly doped polysilicon layers increases with annealing time as compared to the heavily doped polysilicon layers. Similar to the discussion above, the formation of cobalt silicide islands contributes to higher sheet resistance.

Figure 12B:
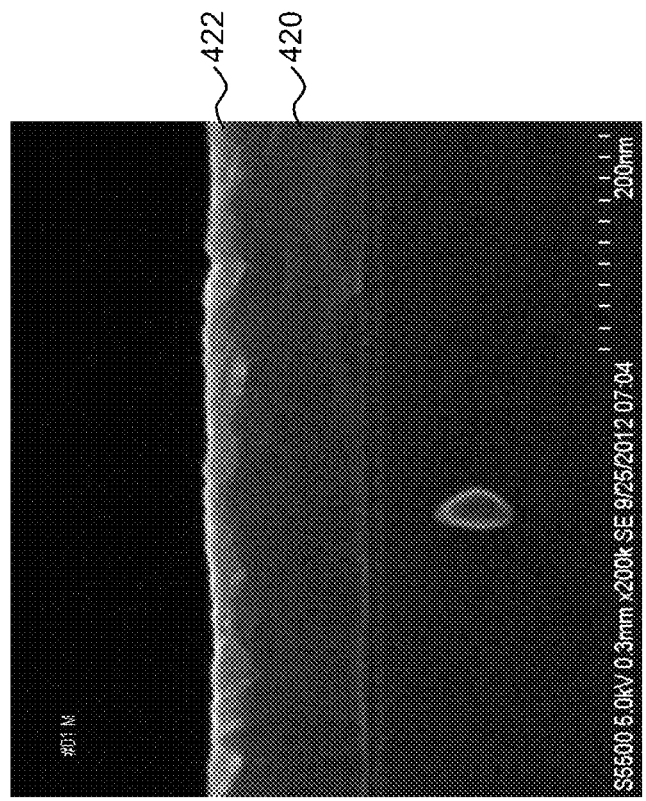
FIG. 12B is a cross-sectional view of an exemplary semiconductor device having a heavily doped polysilicon layer.
Figure 12A:
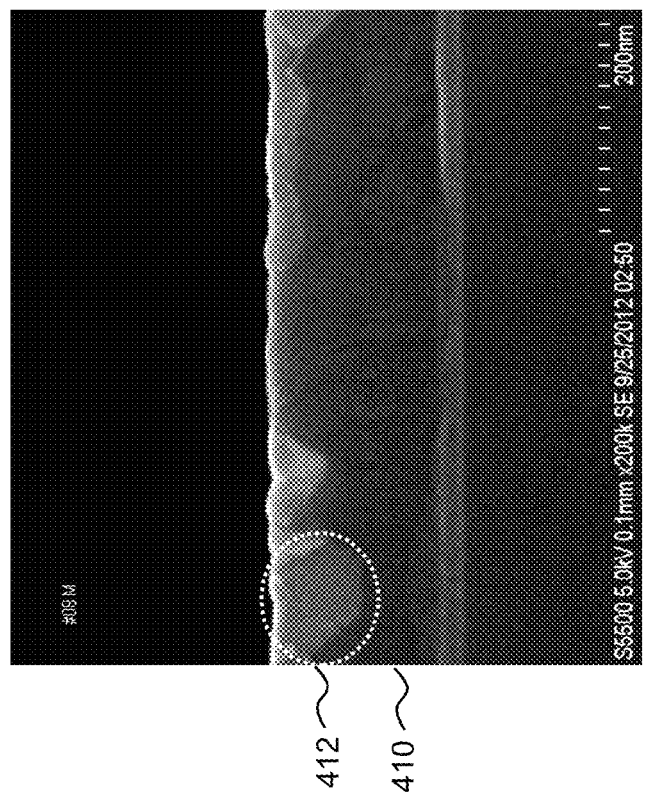
FIG. 12A is a cross-sectional view of an exemplary semiconductor device having a lightly doped polysilicon layer.

FIG. 12A shows an exemplary polysilicon layer 410 that was lightly P-doped (e.g., a concentration of 1.25E20 $cm^{-3}$) prior to an annealing step that formed cobalt silicide. A cobalt silicide agglomeration 412 has been formed in the polysilicon layer 410, which can lead to higher sheet resistance. FIG. 12B shows an exemplary polysilicon layer 410 that was heavily P-doped (e.g., a concentration of 1.85E20 $cm^{-3}$) prior to an annealing step that formed cobalt silicide. A cobalt silicide layer 422 is formed over the polysilicon layer 420 with fewer or no agglomerations of cobalt silicide. Thus, thermal stability can be improved and a lower sheet resistance can be achieved by heavily P-doping the polysilicon.

Figure 13:
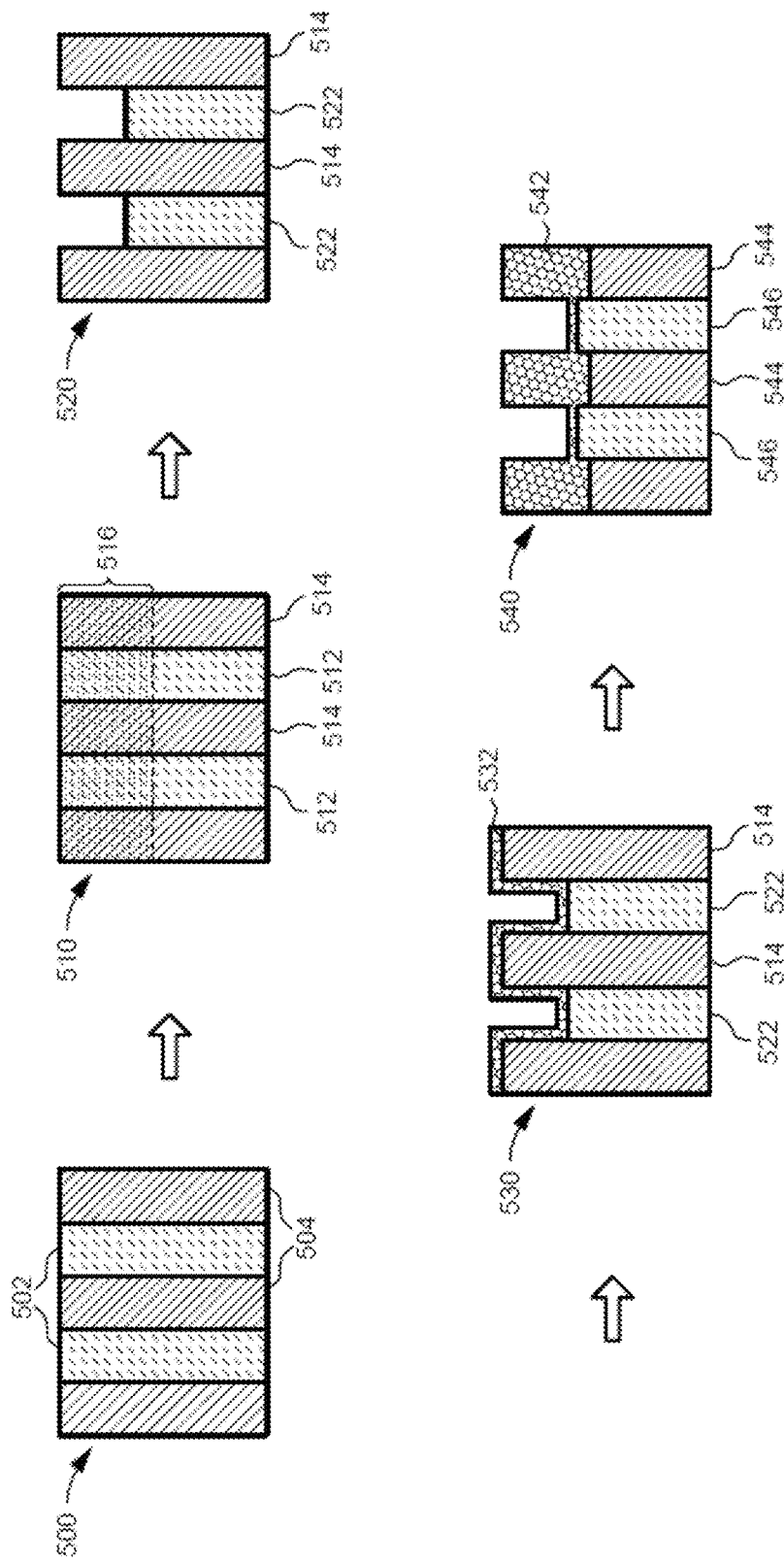
FIG. 13 is a flow diagram showing exemplary cross-sectional views of an exemplary process and structures for forming a cobalt silicide layer.

FIG. 13 is a flow diagram showing exemplary cross-sectional views of an exemplary process and structures for forming a cobalt silicide layer. A semiconductor device 500 includes alternating and vertically oriented oxide portions 502 and polysilicon portions 504. A carbon implantation, for example, a pre-amorphization implant (PAI), is performed to provide the semiconductor device 510. The semiconductor device 520 includes a carbon implanted region 516 in alternating and vertically oriented oxide portions 512 and 514. An etch, for example a Siconi etch, is performed to provide the semiconductor device 530. As compared to the semiconductor device 520, the oxide portions 522 have been etched. A cobalt layer 532 is formed over the semiconductor device 520, for example by deposition, to provide the semiconductor device 530. An annealing process, for example a rapid thermal process, is performed on the semiconductor device 530 to provide the semiconductor device 540. The semiconductor device 540 includes the cobalt silicide layer 542 formed over the polysilicon regions 544 and the oxide regions 546.

Figure 14B:
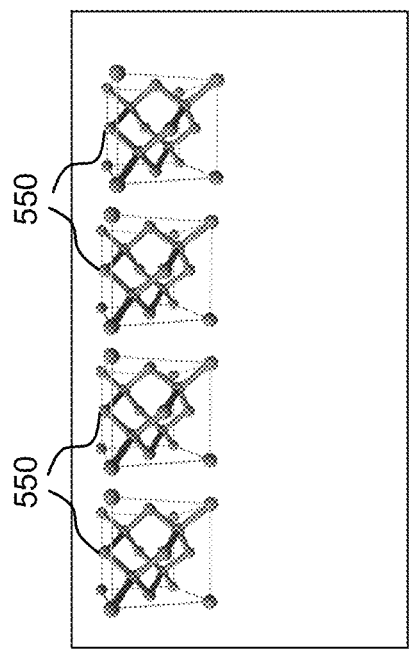
FIG. 14B is a cross-sectional view of an exemplary polysilicon layer after a carbon implantation.
Figure 14A:
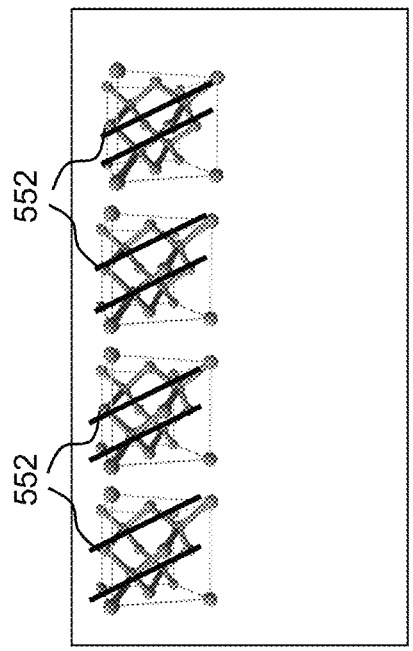
FIG. 14A is a cross-sectional view of an exemplary polysilicon layer.

As discussed above, the implant of carbon in the polysilicon layer can improve sheet resistance of a formed silicide. FIG. 14A shows an exemplary polysilicon layer, which includes silicon crystals 550. FIG. 14B shows an exemplary polysilicon layer after a carbon implantation. The bonds in the silicon crystals 552 have been broken. Lighter species, like carbon, self amorphize allowing for a thick and uniform amorphous layer in the poly structure.

Under a room temperature implant, lighter species, like carbon, would not form amorphous layer. However, under colder conditions such as −100 C, a more uniform and smoother amorphous layer is formed. The Si—Si bonding breaks and cobalt is enabled to react with silicon to form a thicker silicide (e.g, $CoSi_2$), which reduces sheet resistance.

As compared to a pre-amorphization implant (PAI) of nitrogen, for example at 30 KeV and a dosage of $2e15$ cm$^{-3}$, a carbon PAI implant breaks the Si bonding of the polysilicon film structure in a manner that allows for a more uniform and continuous amorphous layer to be formed near the wafer surface. Thus, cobalt atoms can react with silicon atoms to form a thicker silicide more easily. A thicker silicide has a lower resistance and therefore can have better electrical performance. Additionally, variability in the process can be reduced to provide a better, tighter distribution of sheet resistance.

FIG. 15 shows cross-sectional views of exemplary semiconductor devices 600, 610, 620, 630, 640 and 650. The devices 600, 610, 620, 630, 640 and 650 are drawn with a surface 660 of the respective substrates (e.g., silicon) aligned. The devices 600, 610, 620, 630, 640 and 650 show a carbon implantation carried out at −100 C, −80 C, −60 C, −40 C, −20 C and room temperature respectively, for example at 6 keV and a concentration of $1e15$ cm$^{-3}$. At room temperature (device 650), the carbon implant causes significant crystal damage and an amorphous layer is not formed. The devices for which the carbon implant is performed below 0 C (600, 610, 620, 630 and 640) include the amorphous layers 602, 612, 622, 632 and 642 respectively. At the lower temperatures, the amorphization is more complete than at the higher temperatures. The devices 600 and 610 for which the carbon implantation is performed at −100 C and −80 C may be referred to as exhibiting complete amorphization. The devices 620, 630 and 640 for which the carbon implantation is performed at −60 C, −40 C and −20 C may be referred to as partially amorphous.

Cold implantation enables lighter species like carbon to self amorphize. The amorphous layer thickness is increased and has a smoother interface with reduced cold implant temperature, which can improve current leakage performance. If the interface is rough, there is a large amount of defects in the interface. Defects can result in current leakage during device operation. Therefore, a smooth interface means that the defect count is reduced and the current leakage performance is improved. It will be appreciated that cold implantation of light species can be used to improve silicide formation generally, and this approach is not limited to the formation of cobalt silicide.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor device, comprising:
    a polysilicon layer doped with carbon and phosphorous; and
    a metal silicide layer formed over the polysilicon layer.

2. The semiconductor device of claim 1, wherein the concentration of the phosphorous in the polysilicon layer is higher than 1.25e20 atoms/cm$^3$.

3. The semiconductor device of claim 1, wherein the metal silicide layer is a cobalt silicide layer.

4. The semiconductor device of claim 3, wherein the cobalt silicide layer includes carbon.

5. The semiconductor device of claim 3, wherein the cobalt silicide layer includes phosphorous.

6. The semiconductor device of claim 1, wherein the metal silicide layer includes carbon.

7. The semiconductor device of claim 1, wherein the metal silicide layer includes phosphorous.

8. The semiconductor device of claim 1, further comprising a charge storage structure that includes an oxide/nitride/oxide laminated layer and a second polysilicon layer.

9. A method of forming a semiconductor device, comprising:
    forming a polysilicon layer doped with carbon and phosphorous;

forming a metal layer over the polysilicon layer; and annealing the semiconductor device to form a metal silicide layer.

10. The method of claim 9, wherein the concentration of the phosphorous in the polysilicon layer is higher than 1.25e20 atoms/cm$^3$.

11. The method of claim 9, wherein the carbon and phosphorous doped polysilicon layer is formed in a single in-situ process.

12. The method of claim 9, wherein the forming the polysilicon layer doped with carbon includes implanting, with an ion implantation process, carbon atoms in the polysilicon layer.

13. The method of claim 12, wherein the ion implantation process is performed at a temperature below room temperature.

14. The method of claim 13, wherein the temperatures is below 0 C.

15. The method of claim 13, wherein the temperature is below −50 C.

* * * * *